United States Patent
Izumi et al.

(10) Patent No.: US 7,495,866 B2
(45) Date of Patent: Feb. 24, 2009

(54) RECORDING DISK DRIVE CAPABLE OF SUPPRESSING VIBRATION OF FLEXIBLE PRINTED CIRCUIT BOARD

(75) Inventors: Mitsuhiro Izumi, Kawasaki (JP);
Mitsuaki Yoshida, Kawasaki (JP);
Hisashi Kaneko, Kawasaki (JP);
Tsuneyori Ino, Kawasaki (JP); Yukihiro Komura, Kawasaki (JP); Shinji Fujimoto, Kawasaki (JP); Kei Funabashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 248 days.

(21) Appl. No.: 10/893,301

(22) Filed: Jul. 19, 2004

(65) Prior Publication Data

US 2005/0190489 A1  Sep. 1, 2005

(30) Foreign Application Priority Data

Feb. 27, 2004 (JP) .............................. 2004-054357

(51) Int. Cl.
*G11B 5/55* (2006.01)
*G11B 21/08* (2006.01)
(52) U.S. Cl. ................................ 360/264.2; 360/245.9
(58) Field of Classification Search ............. 360/264.2, 360/266.3, 245.8, 245.9, 97.02, 97.03, 246
See application file for complete search history.

(56) References Cited

U.S. PATENT DOCUMENTS 5,585,979 A * 12/1996 Erpelding et al. ........ 360/245.8
5,907,452 A * 5/1999 Kan ....................... 360/97.01
5,965,249 A * 10/1999 Sutton et al. ............. 428/304.4

2003/0235012 A1* 12/2003 Nishizawa ............... 360/264.2

FOREIGN PATENT DOCUMENTS

JP     03-077485    8/1991

(Continued)

OTHER PUBLICATIONS

R. Plunkett and C.T. Lee, "Length Optimization for Constrained Viscoelastic Layer Damping," The Journal of the Acoustical Society of American, vol. 48, pp. 150-161 (1970), no month.*

(Continued)

*Primary Examiner*—Brian E Miller
*Assistant Examiner*—Adam B Dravininkas
(74) *Attorney, Agent, or Firm*—Kratz, Quintos & Hanson, LLP.

(57) ABSTRACT

A fixing member is spaced from a head actuator by a predetermined distance. A flexible printed circuit board extends at least from the head actuator to the fixing member. The flexible printed circuit board is superposed on the surface of the fixing member. A viscoelastic layer and a protecting layer are overlaid on the surface of the flexible printed circuit board. A clip clips all the fixing member, the flexible printed circuit board, the viscoelastic layer and the protecting layer together. When a head slider is positioned, the head actuator changes its attitude relative to a recording disk. The inertial force based on the rotation causes the first flexible printed circuit board to vibrate when the actuator block stops rotating. The viscoelastic layer serves to absorb this residual vibration of the first flexible printed circuit board. Vibration of the flexible printed circuit board can be suppressed.

5 Claims, 7 Drawing Sheets

FOREIGN PATENT DOCUMENTS

| | | |
|---|---|---|
| JP | 05-074070 | 3/1993 |
| JP | 10-134529 | 5/1998 |
| JP | 10134529 A * | 5/1998 |
| JP | 2001-222881 | 8/2001 |
| JP | 2001-263316 | 9/2001 |

OTHER PUBLICATIONS

Eugene D. Veilleux, "Vibration Control of Printed-Circuit Boards in a Dynamic Environment," IEEE Transactions on Parts, vol. PMP-6, No. 3, pp. 100-105 Sep. 1970.*

B. Azvine, R.J.Wynne, and G.R. Tomlinson, "Active Damping For The Control of Flexible Structures," IEEE Control, 1994. Control '94. vol. 2., Conference Publication No. 389. Mar. 1994.*

Probst, Mark R. "Viscoelastic Polymer for Printed-Circuit-Board Vibration Damping." Report HDL-TM-79-22. National Technical Information Service. Sep. 1979.*

Japanese Office Action mailed Sep. 4, 2007 with English translation (5 pages).

* cited by examiner

RECORDING DISK DRIVE CAPABLE OF SUPPRESSING VIBRATION OF FLEXIBLE PRINTED CIRCUIT BOARD

BACKGROUND OF THE INVENTION

1. Field of the Invention

The present invention relates to a recording disk drive such as a hard disk drive (HDD). In particular, the invention relates to a recording disk drive comprising: a head actuator; a fixing member spaced from the head actuator by a predetermined distance; and a flexible printed circuit board attached to the head actuator so as to extend at least from the head actuator to the fixing member.

2. Description of the Prior Art

A head actuator is incorporated in a hard disk drive (HDD) so as to change its attitude relative to a magnetic recording disk. The head actuator comprises an actuator block coupled to a vertical support shaft. Actuator arms are defined in the actuator block. A head suspension is fixed to the corresponding actuator arm so as to support a head slider at the tip end thereof. A first flexible printed circuit board is attached to the actuator block so as to supply a sensing current or a writing current to the head slider. The first flexible printed circuit board extends to the fixing member spaced from the actuator block by a predetermined distance.

Positioning holes are defined in the first flexible printed circuit board. Pins are designed to protrude from the surface of the actuator block. When the first flexible printed circuit board is attached to the actuator block, the pins are inserted in the corresponding positioning holes. The first flexible printed circuit board is thus positioned on the actuator block. The first flexible printed circuit board is then fixed to the actuator block with a fastening member such as a screw. A second flexible printed circuit board is thereafter coupled to the first flexible printed circuit board so as to extend from the actuator block to the head slider. The second flexible printed circuit board is integral to the head suspension. The head suspension and the second flexible printed circuit board form a so-called long tale head.

When the head slider is positioned, the actuator block intermittently repeats rotation around the vertical support shaft. The inertial force of the rotation forces the first flexible printed circuit board to vibrate when the actuator block stop rotating. This residual vibration is transmitted to the actuator block or the like. Reading and writing operation of magnetic bit data is hindered.

If the second flexible printed circuit board is integral to the head suspension, the displacement of the second flexible printed circuit board is particularly limited when the second flexible printed circuit board is to be positioned relative to the first flexible printed circuit board. Accordingly, the first flexible printed circuit board must be positioned on the actuator block at a higher accuracy prior to the positioning of the second flexible printed circuit board. However, a sufficient accuracy of the positioning of the first flexible printed circuit board cannot be achieved with the conventional positioning hole.

SUMMARY OF THE INVENTION

It is accordingly an object of the present invention to provide a recording disk drive capable of suppressing vibration of a flexible printed circuit board when a head actuator changes its attitude. It is accordingly another object of the present invention to provide a recording disk drive capable of positioning a flexible printed circuit board on a head actuator with a higher accuracy. It is accordingly still another object of the present invention to provide a flexible printed circuit board unit and a flexible printed circuit board greatly useful to realize the aforementioned recording disk drive.

According to a first aspect of the present invention, there is provided a recording disk drive comprising: a recording disk; a head actuator designed to change its attitude relative to the recording disk; a fixing member spaced from the head actuator by a predetermined distance; a flexible printed circuit board extending at least from the head actuator to the fixing member and superposed on the surface of the fixing member; a viscoelastic layer overlaid on the surface of the flexible printed circuit board; and a clip designed to clip all the fixing member, the flexible printed circuit board and the viscoelastic layer together.

The head actuator changes its attitude relative to the recording disk during rotation of the recording disk in the recording disk drive. The inertial force based on the rotation causes the flexible printed circuit board to vibrate when the head actuator stops rotating. The viscoelastic layer serves to absorb the vibration of the flexible printed circuit board. The head actuator is prevented from receiving transmission of the vibration. Information can correctly be read and written.

Moreover, the viscoelastic layer serves to prevent the flexible printed circuit board from contacting the clip. The viscoelastic layer serves to protect the flexible printed circuit board. Protection of the flexible printed circuit board in this manner serves to avoid exposure of an electrically-conductive pattern in the flexible printed circuit board. The electrically-conductive pattern can reliably be prevented from short and disconnection. It should be noted that a protecting layer may be formed on the surface of the viscoelastic layer to receive the clip.

Furthermore, employment of the clip serves to realize an easier attachment of the flexible printed circuit board to the fixing member. Attachment process can be realized in more effective manner. On the other hand, a double-sided adhesive tape is interposed between the flexible printed circuit board and the fixing member in a conventional recording disk drive. When the double-sided adhesive tape is to be applied, protection sheets must be peeled off from the both sides of the double-sided adhesive tape. This is inefficient.

A specific flexible printed circuit board unit may be provided to realize the aforementioned recording disk drive. The flexible printed circuit board unit comprises a flexible printed circuit board attached to a head actuator; and a viscoelastic layer overlaid on the surface of the flexible printed circuit board.

According to a second aspect of the present invention, there is provided a recording disk drive comprising: a head slider; a head actuator coupled to a support shaft for relative rotation so as to support the head slider at the tip end of the head actuator; a pin protruding from the surface of the head actuator; a first flexible printed circuit board attached on the head actuator, said first flexible printed circuit board defining a predetermined through bore designed to receive insertion of the pin; a second flexible printed circuit board received on the first flexible printed circuit board on the head actuator. In this case, the first flexible printed circuit board includes: an insulating thin film; an electrically-conductive film piece located on the surface of the insulating thin film; an insulating layer overlaid on the surface of the insulating thin film and designed to partly cover over the contour of the electrically-conductive film piece; an aperture formed in the insulating layer so as to expose the contour of the electrically-conductive film along a first reference line on the surface of the insulating thin film. In addition, a clearance is established for the insertion of the pin within the through bore in the direction of a second reference line perpendicular to the first reference line.

When the first flexible printed circuit board is fixed on the head actuator, the first flexible printed circuit board is superposed on the surface of the head actuator. The through bore of the first flexible printed circuit board receives the insertion of the pin. The contour of the electrically-conductive film piece within the aperture is then detected with an image recognition apparatus. A shift is thus measured along the second reference line in the first flexible printed circuit board. The amount of shift is measured based on a predetermined reference position. The first flexible printed circuit board is positioned on the head actuator based on the amount of shift measured. The positioning of the first flexible printed circuit board can be realized with a high accuracy. Since the predetermined clearance is established for the pin within the through bore in the direction of the second reference line, the first flexible printed circuit board can be displaced on the head actuator for establishment of a higher accuracy.

A specific flexible printed circuit board may be provided to realize the aforementioned recording disk drive. The flexible printed circuit board comprises: an insulating thin film; an electrically-conductive film piece located on the surface of the insulating thin film; an insulating layer overlaid on the surface of the insulating thin film and designed to partly cover over the contour of the electrically-conductive film piece; an aperture formed in the insulating layer so as to expose the contour of the electrically-conductive film piece along a first reference line on the surface of the insulating thin film; and an elongated opening formed at least through the insulating thin film, the elongated opening extending along a second reference line perpendicular to the first reference line.

According to a third aspect of the present invention, there is provided a recording disk drive comprising: a head slider; a head actuator coupled to a support shaft for relative rotation so as to support the head slider at the tip end of the head actuator; a pin protruding from the surface of the head actuator; a first flexible printed circuit board attached on the head actuator, said first flexible printed circuit board defining a predetermined through bore designed to receive insertion of the pin; and a second flexible printed circuit board received on the first flexible printed circuit on the head actuator. In this case, the first flexible printed circuit board includes: an insulating thin film; an electrically-conductive film piece located on the surface of the insulating thin film and designed to partly describe its contour along a pair of first reference lines extending in parallel; and an insulating layer overlaid on the surface of the insulating thin film, said insulating layer defining an aperture designed to cross the electrically-conductive film piece along a second reference line perpendicular to the first reference lines. In addition, a clearance is established for the insertion of the pin in the through bore in the direction of the second reference line.

When the first flexible printed circuit board is fixed on a head actuator, the first flexible printed circuit is superposed on the surface of the head actuator. The through bore of the first flexible printed circuit board receives the insertion of the pin. The contour of the electrically-conductive film piece within the aperture is then detected with an image recognition apparatus. A shift is thus measured along the second reference line in the first flexible printed circuit board. The amount of shift is measured based on a predetermined reference position. The first flexible printed circuit board is positioned on the head actuator based on the amount of shift measured. The positioning of the first flexible printed circuit board can be realized with a high accuracy. Since the predetermined clearance is established for the pin within the through bore in the direction of the second reference line, the first flexible printed circuit board can be displaced on the head actuator for establishment of a higher accuracy.

A specific flexible printed circuit board may be provided to realize the aforementioned recording disk drive. The flexible printed circuit board comprises: an insulating thin film; an electrically-conductive film located on the surface of the insulating thin film and designed to partly describe its contour along a pair of first reference lines extending in parallel; an insulating layer overlaid on the surface of the insulating thin film, said insulating layer defining an aperture designed to cross the electrically-conductive film piece along a second reference line perpendicular to the first reference lines; and an elongated opening formed at least through the insulating thin film, said elongated opening extending along the second reference line.

BRIEF DESCRIPTION OF THE DRAWINGS

The above and other objects, features and advantages of the present invention will become apparent from the following description of the preferred embodiments in conjunction with the accompanying drawings, wherein.

DESCRIPTION OF THE PREFERRED EMBODIMENTS

Figure 1:
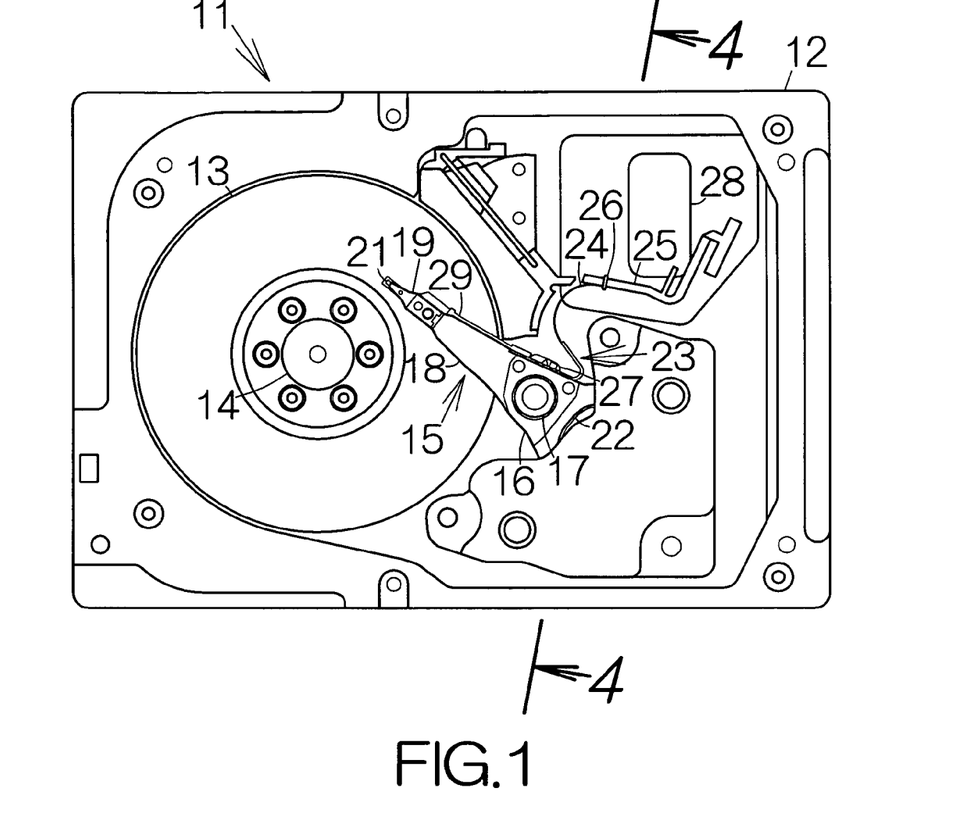
FIG. 1 is a plan view schematically illustrating the structure of a hard disk drive (HDD) as an example of a recording disk drive according to an embodiment of the present invention.

FIG. 1 schematically illustrates the inner structure of a hard disk drive (HDD) 11 as an example of a recording disk drive or storage device according to an embodiment of the present invention. The HDD 11 includes a box-shaped main enclosure 12 defining an inner space. At least one magnetic recording disk 13 is mounted on the driving shaft of a spindle motor 14 within the main enclosure 12. The spindle motor 14 is allowed to drive the magnetic recording disk 13 for rotation at a higher revolution speed such as 10,000 rpm, 15,000 rpm, or the like, for example. A cover, not shown, is coupled to the main enclosure 12 so as to define the closed inner space between the main enclosure 12 and the cover itself.

A head actuator 15 is also accommodated in the inner space of the main enclosure 12. The head actuator 15 comprises an actuator block 16. The actuator block 16 is coupled to a vertical support shaft 17 for relative rotation. The rotation of the actuator block 16 allows the head actuator 15 to change its attitude relative to the magnetic recording disk 13. Rigid actuator arms 18 are defined in the actuator block 16 so as to extend in the horizontal direction from the vertical support shaft 17. The actuator arms 18 are related to the front and back surfaces of the magnetic recording disk 13. The actuator block 16 may be made of aluminum. Molding process maybe employed to form the actuator block 16.

Head suspensions 19 are fixed to the corresponding tip ends of the actuator arms 18. The individual head suspension 19 extends forward from the tip end of the actuator arm 18. A flying head slider 21 is supported on the front end of the head suspension 19. The flying head sliders 21 are in this manner connected to the actuator block 16. The flying head sliders 21 are opposed to the surfaces of the magnetic recording disk 13. As conventionally known, in the case where two or more magnetic recording disks 13 are incorporated within the inner space of the main enclosure 12, a pair of the actuator arm 18 as well as a pair of the head suspension 19 is disposed between the adjacent magnetic recording disks 13.

An electromagnetic transducer, not shown, is mounted on the flying head slider 21. The electromagnetic transducer may include a read element and a write element. The read element may include a giant magnetoresistive (GMR) element or a tunnel-junction magnetoresistive (TMR) element designed to discriminate magnetic bit data on the magnetic recording disk 13 by utilizing variation in the electric resistance of a spin valve film or a tunnel-junction film, for example. The write element may include a thin film magnetic head designed to write magnetic bit data into the magnetic recording disk 13 by utilizing a magnetic field induced at a thin film coil pattern.

The head suspension 19 serves to urge the flying head slider 21 toward the surface of the magnetic recording disk 13. When the magnetic recording disk 13 rotates, the flying head slider 21 is allowed to receive airflow generated along the rotating magnetic recording disk 13. The airflow serves to generate a positive pressure or lift on the flying head slider 21. The flying head slider 21 is thus allowed to keep flying above the surface of the magnetic recording disk 13 during the rotation of the magnetic recording disk 13 at a higher stability established by the balance between the urging force of the head suspension 19 and the lift.

A power source such as a voice coil motor (VCM) 22 is connected to the actuator block 17. The power source 22 is designed to drive the actuator block 17 for rotation around the support shaft 16. The rotation of the actuator block 17 induces the swinging movement of the actuator arms 18 and the head suspensions 19. When the actuator arm 18 is driven to swing about the support shaft 16 during the flight of the flying head slider 21, the flying head slider 21 is allowed to cross the recording tracks defined on the magnetic recording disk 13 in the radial direction of the magnetic recording disk 13. This radial movement serves to position the flying head slider 21 right above a target recording track on the magnetic recording disk 13.

A flexible printed circuit board unit 23 is superposed on the actuator block 16. The flexible printed circuit board unit 23 comprises a first flexible printed circuit board 24. One end of the first flexible printed circuit board 24 is attached to a side surface of the actuator block 16. The first flexible printed circuit board 24 bends and extends toward a fixing member 25 spaced from the head actuator 15 by a predetermined distance. The other end of the first flexible printed circuit board 24 is superposed on the surface of the fixing member 25. A clip 26 is employed to hold the other end of the first flexible printed circuit board 24 on the fixing member 25. The fixing member 25 is a component separate from the main enclosure 12.

A head IC (integrated circuit) or preamplifier IC 27 is mounted on the surface of the first flexible printed circuit board 24. The preamplifier IC 27 is designed to supply the read element with a sensing current when the magnetic bit data is to be read. The preamplifier IC 27 is also designed to supply the write element with a writing current when the magnetic bit data is to be written. A small-sized circuit board 28 is located within the inner space of the main enclosure 12. The circuit board 28 is designed to supply the preamplifier IC 27 on the flexible printed circuit board unit 23 with a sensing and a writing current. A printed circuit board, not shown, may be coupled to the back of the bottom plate of the main enclosure 12. The printed circuit board may also be designed to supply the preamplifier IC 27 on the flexible printed circuit board unit 23 with a sensing and a writing current.

Second flexible printed circuit boards 29 are utilized for supplying the sensing and writing currents. The individual second flexible printed circuit board 29 is designed to extend from the head suspension 19 to the actuator block 16. The front end of the second flexible printed circuit board 29 is superposed on the surface of the head suspension 19. Wiring patterns on the second flexible printed circuit board 29 are connected to the flying head slider 21. The rear end of the second flexible printed circuit board 29 is received on the first flexible printed circuit board 24 on the actuator block 16. The wiring patterns on the second flexible printed circuit board 29 are connected to wiring patterns on the first flexible printed circuit board 24. The flying head slider 21 is in this manner electrically connected to the flexible printed circuit board unit 23. The second flexible printed circuit board 29 is located for the individual actuator arms 18.

Figure 2:
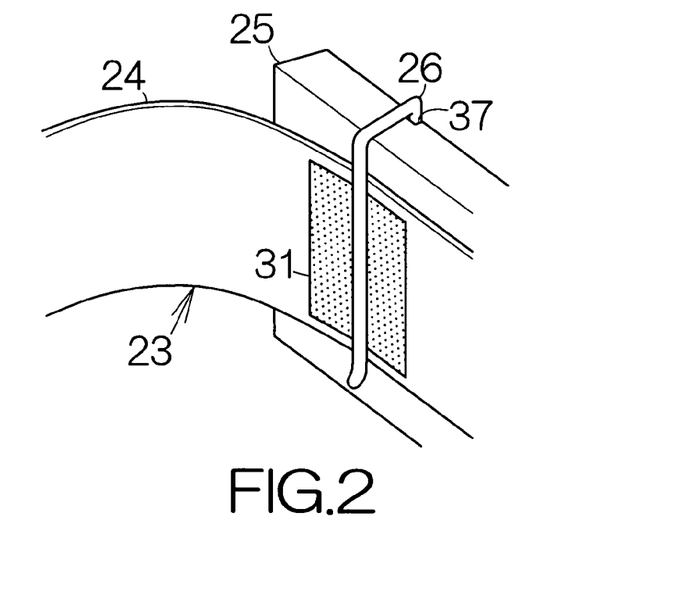
FIG. 2 is an enlarged partial perspective view of a first flexible printed circuit board along with a fixing member and a clip.

As shown in FIG. 2, the flexible printed circuit board unit 23 comprises an elastic sheet 31. The elastic sheet 31 is overlaid on the surface of the first flexible printed circuit board 24. An adhesive layer may be formed on the back surface of the elastic sheet 31. The elastic sheet 31 is located at least between the first flexible printed circuit board 24 and the clip 26. The clip 26 thus clips all of the fixing member 25, the first flexible printed circuit board 24 and the elastic sheet 31 superposed one another. The elastic sheet 31 serves to prevent the clip 26 from contacting the first flexible printed circuit board 24.

Figure 3:
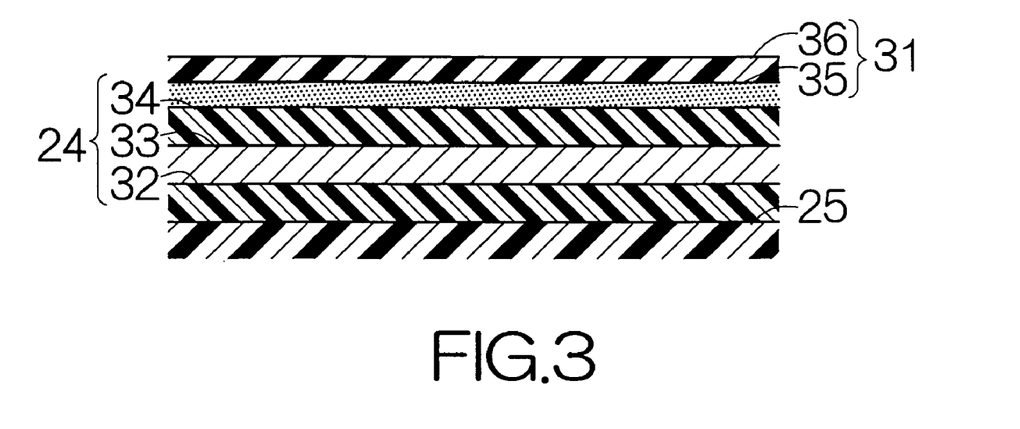
FIG. 3 is an enlarged vertical sectional view illustrating the inner structure of the first flexible printed circuit and an elastic sheet.

As shown in FIG. 3, the first flexible printed circuit board 24 comprises an insulating thin film 32, an electrically-conductive layer 33 overlaid on the upper surface of the insulating thin film 32 and an insulating layer 34 superposed on the upper surface of the electrically-conductive layer 33. The electrically-conductive layer 33 forms wiring patterns extending on the first flexible printed circuit board 24. The electrically-conductive layer 33 may be made of an electrically-conductive material such as Cu, for example. The insulating thin film 32 and the insulating layer 34 may be made of a resin material such as polyimide resin, for example. An adhesive layer, not shown, may be interposed between the insulating thin film 32 and the electrically-conductive layer 33 and between the electrically-conductive layer 33 and the insulating layer 34.

The elastic sheet 31 comprises a viscoelastic layer 35 overlaid on the surface of the first flexible printed circuit board 24 and a protecting layer 36 overlaid on the surface of the viscoelastic layer 35. The viscoelastic layer 35 may be made of a VEM (viscoelastic material), for example. The protecting layer 36 may be made of a resin material such as polyimide resin, for example. The protecting layer 36 serves to prevent the viscoelastic layer 35 from deforming. The viscoelastic layer 35 and the protecting layer 36 may respectively have the thickness of approximately 25 μm. As described above, an adhesive layer, not shown, may be formed between the viscoelastic layer 35 and the first flexible printed circuit board 24.

Figure 4:
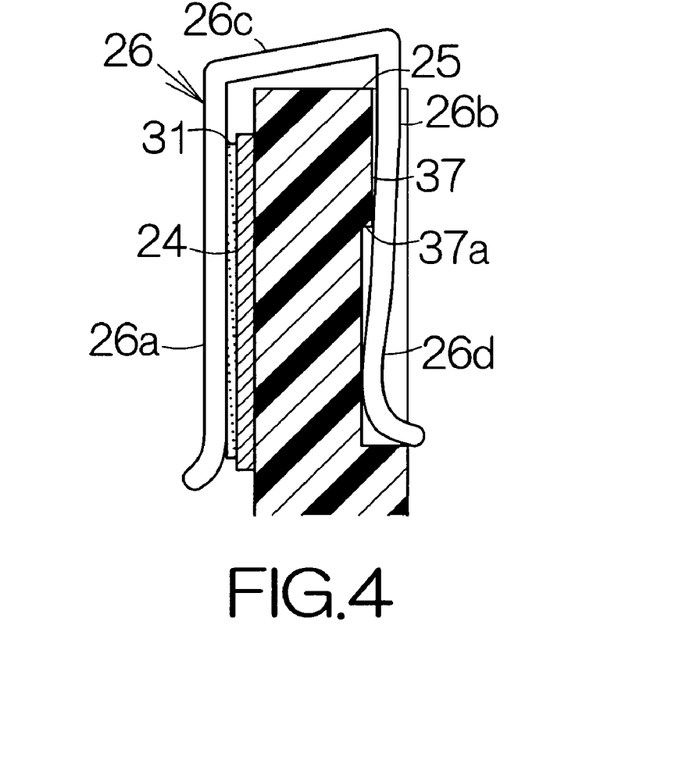
FIG. 4 is an enlarged vertical sectional view of the fixing member and the first flexible printed circuit board, taken along the line 4-4 in FIG. 1.

As shown in FIG. 4, the clip 26 includes first and second contacting portions 26a, 26b extending in parallel. A connecting portion 26c connects one end of the first contacting portion 26a with one end of the second contacting portion 26b. The first contacting portion 26a is designed to contact the surface of the elastic sheet 31 on the surface of the fixing member 25. The second contacting portion 26b is designed to contact the back surface of the fixing member 25. The clip 26 has an elasticity to get the first and the second contacting portions 26a, 26b closer to each other. The clip 26 may be made of a metal material such as a stainless steel, for example.

The other ends or free ends of the first and second contacting portions 26a, 26b are designed to gradually bend outward from each other. This allows the clip 26 to be smoothly mounted on the fixing member 25 without scratching the first flexible printed circuit board 24 and/or the elastic sheet 31. A bent portion 26d is also established in the second contacting portion 26b. The second contacting portion 26b gets closer to the first contacting portion 26a at the bent portion 26d. The bent portion 26d is located adjacent the other or free end of the second contacting portion 26b. It should be noted that a clip of any type or shape may be employed in place of the aforementioned one.

A groove 37 is formed on the back surface of the fixing member 25. The groove 37 extends in a direction perpendicular to the top edge of the fixing member 25. This groove 37 is allowed to guide movement of the bent portion 26d of the second contacting portion 26b. A deeper depression 37a is formed at the lower end of the groove 37. The deeper depression 37a is designed to receive the bent portion 26d of the clip 26. The deeper depression 37a serves to prevent the clip 26 from slipping off the fixing member 25.

Figure 5:
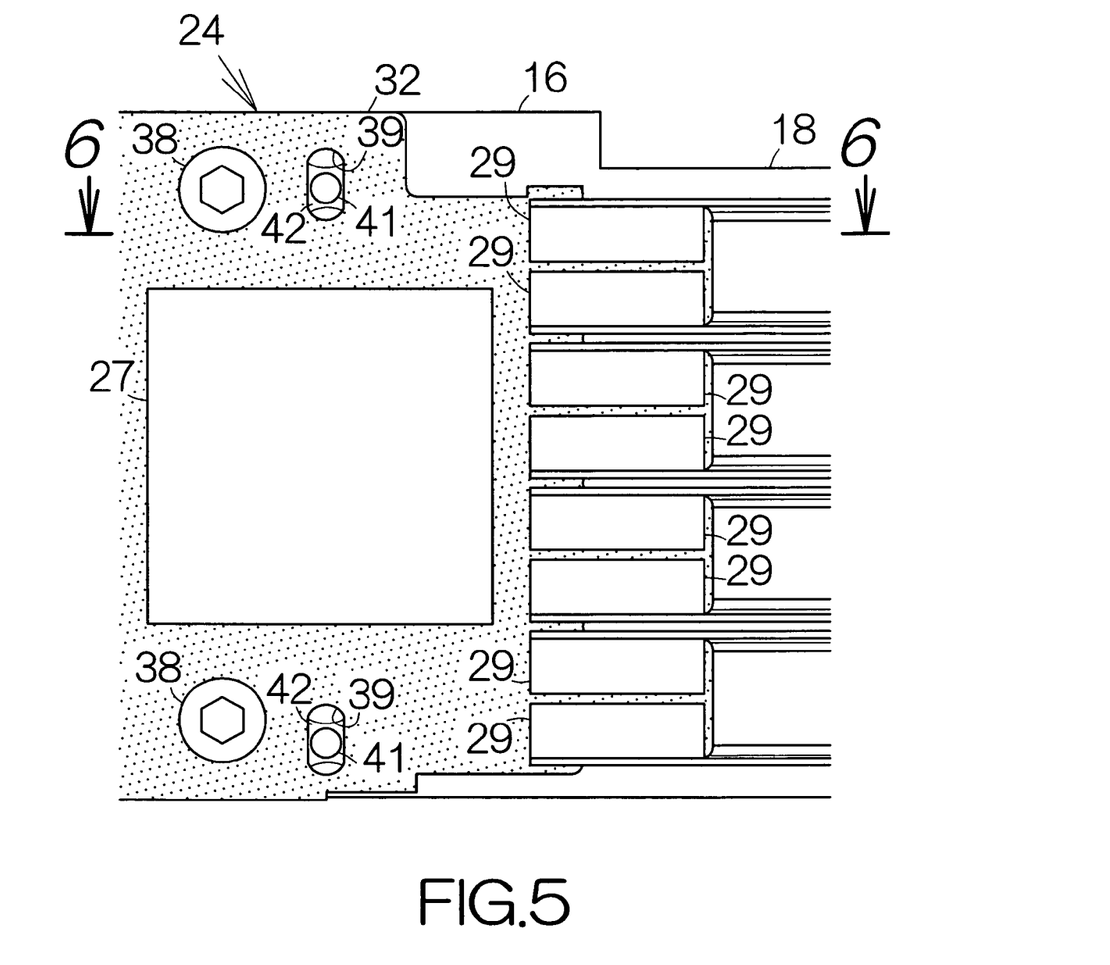
FIG. 5 is an enlarged partial plan view schematically illustrating a part of the first flexible printed circuit board along with a second flexible printed circuit board.

As shown in FIG. 5, the first flexible printed circuit board 24 is fixed to the side surface of the actuator block 16 with screws 38, for example. Through bores or elongated openings 39 are defined in the first flexible printed circuit board 24. The elongated openings 39 are designed to penetrate through at least the insulating thin film 32. Here, two of the elongated opening 39 may be defined in the first flexible printed circuit board 24, for example. The individual elongated opening 39 is allowed to receive a pin 41 protruding from the side surface of the actuator block 16. Solder materials 42 serve to establish connection between the pins 41 and the electrically-conductive layer 33 of the first flexible printed circuit board 24.

Figure 6:
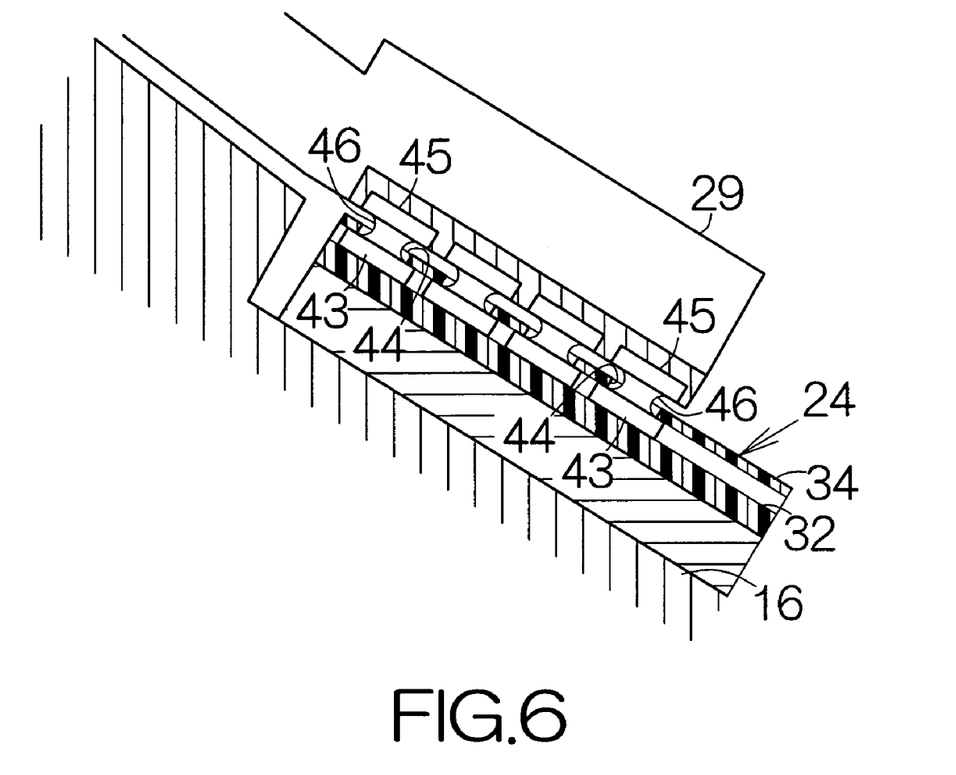
FIG. 6 is a partial sectional view taken along the line 6-6 in FIG. 5.

The second flexible printed circuit board 29 is superposed on the surface of the first flexible printed circuit board 24. As shown in FIG. 6, electrically-conductive film pieces 43 are located on the surface of the insulating thin film 32. The electrically-conductive film pieces 43 are electrically connected to the aforementioned electrically-conductive layer 33. Apertures 44 are defined in the insulating layer 34 superposed on the surface of the insulating thin film 32. The individual aperture 44 is allowed to partly expose the electrically-conductive film piece 43. On the other hand, electrically-conductive pads 45 are located on the second flexible printed circuit board 29. Solder materials 46 connects the electrically-conductive film pieces 43 to the corresponding electrically-conductive pads 45, for example.

Figure 7:
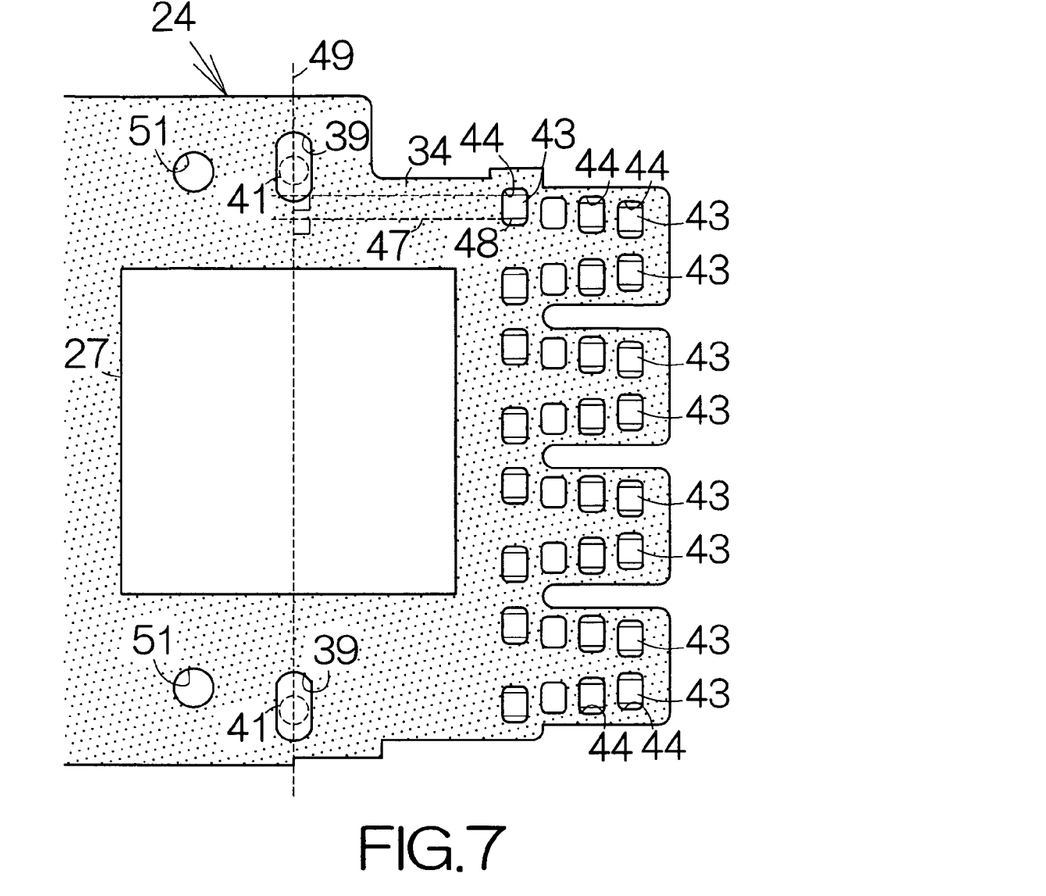
FIG. 7 is an enlarged partial plan view, corresponding to FIG. 5, schematically illustrating a part of the first flexible printed circuit board without the second flexible printed circuit board.

As is apparent from FIG. 7, rows of the electrically-conductive film pieces 43 are arranged in the vertical direction on the first flexible printed circuit board 24. Each row includes four electrically-conductive film pieces 43 arranged in the horizontal direction. A contour 48 of the electrically-conductive film piece 43 is allowed to get exposed in the individual aperture 44 along a pair of first reference line 47 extending in parallel with each other in the horizontal direction.

The elongated openings 39 are designed to extend along a second reference line 49 perpendicular to the first reference lines 47. A predetermined clearance is established for the pin 41 within the elongated opening 39 in the direction of the second reference line 49. This clearance is set larger than a space generally generated due to a tolerance. On the other hand, a clearance is eliminated for the pin 41 to the uttermost within the elongated opening 39 in the direction of the first reference lines 47. The tolerance is reduced to the uttermost in the direction of the first reference lines 47. The contours 48 of the electrically-conductive film pieces 43 and the aperture 44 can in this manner be positioned relative to the elongated opening 39 with a relatively high accuracy.

Through holes 51 are defined in the first flexible printed circuit board 24. The through holes 51 are designed to receive insertion of the aforementioned screw 38. A predetermined clearance is established for the screw 38 within the through hole 51. The clearance is set larger than at least that of the elongated opening 39.

Figure 8:
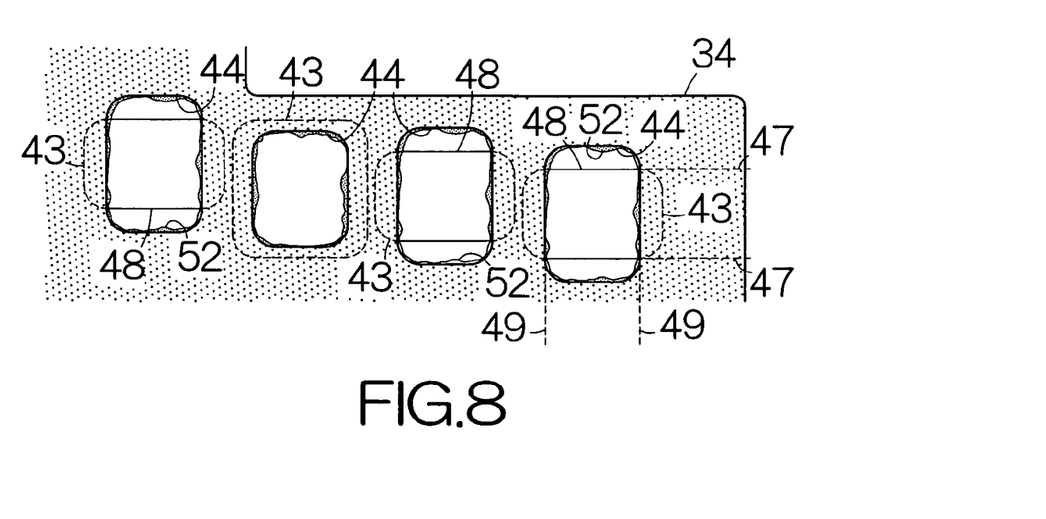
FIG. 8 is an enlarged plan view of apertures in the first flexible printed circuit board.

As is apparent from FIG. 8, the aperture 44 is designed to cross the electrically-conductive film piece 43 along the second reference line 49. The insulating layer 34 is accordingly allowed to cover the opposite ends of the electrically-conductive film pieces 43 in the direction of the first reference lines 47. The insulating layer 34 thus partly covers over the contour 48 of the individual electrically-conductive film piece 43, so that the electrically-conductive film piece 43 is reliably prevented from peeling off the insulating thin film 32. Since the adhesive layers are utilized to layer the insulating thin film 32, the electrically-conductive film pieces 43 and the insulating layer 34, an adhesive 52 leaks inside the apertures 44. The exposed contour 48 may sufficiently be separated from the adhesive 52.

When the flying head slider 21 is positioned, the actuator block 16 intermittently repeats rotation around the vertical support shaft 17 during the rotation of the magnetic recording disk 13 in the aforementioned HDD 11. The inertial force based on the rotation causes the first flexible printed circuit board 24 to vibrate when the actuator block 16 has stopped rotating. The viscoelastic layer 35 of the elastic sheet 31 serves to absorb this residual vibration. In addition, the protecting layer 36 serves to improve the performance of the viscoelastic layer 35. The flying head slider 21 is reliably prevented from receiving transmission of vibration. The reading and writing operation of magnetic bit data can be carried out on the magnetic recording disk 13 at a higher accuracy.

Moreover, the elastic sheet 31 serves to prevent the first flexible printed circuit board 24 from contacting the clip 26. The protecting layer 36 serves to protect the first flexible printed circuit board 24. Protection of the insulating layer 34 from damages in this manner serves to avoid exposure of the electrically-conductive layer 33 in the first flexible printed circuit board 24. The electrically-conductive layer 33 can reliably be prevented from short and disconnection. In addition, employment of the clip 26 serves to realize an easier attachment of the first flexible printed circuit board 24 to the fixing member 25. Attachment process can be realized in more effective manner. A double-sided adhesive tape is interposed between the first flexible printed circuit board 24 and the fixing member 25 in a conventional HDD. When the double-sided adhesive tape is to be applied, protection sheets must be peeled off from the both sides of the double-sided adhesive tape. This is inefficient.

When the HDD 11 is to be assembled, the flexible printed circuit board unit 23 is previously prepared. The elastic sheet 31 has been adhered on the surface of the first flexible printed circuit board 24 in the flexible printed circuit board unit 23. The fixing member 25 is previously held on the first flexible printed circuit board 24 with the clip 26. The clip 26 clips the first flexible printed circuit board 24, the elastic sheet 31 and the fixing member 25. The preamplifier IC 27 has been mounted on the surface of the first flexible printed circuit board 24. The flexible printed circuit board unit 23 is fixed to the actuator block 16.

After the flexible printed circuit board unit 23 has been fixed on the actuator block 16, the head suspensions 19 are fixed to the actuator arms 18. The flying head slider 21 and the second flexible printed circuit board 29 are previously attached to the individual head suspension 19. The electrically-conductive pads 43 on the second flexible printed circuit board 29 are opposed to the electrically-conductive film pieces 43 on the first flexible printed circuit board 24. The solder materials 46 are interposed between the electrically-conductive pads 45 and the electrically-conductive film pieces 43, respectively. The solder materials 46 are then subjected to heat treatment. The solder materials 46 fuse. When the solder materials 46 solidify, electrical connections are established between the electrically-conductive pads 45 and the electrically-conductive film pieces 43. The second flexible printed circuit board 29 is thus coupled to the first flexible printed circuit board 24 or flexible printed circuit board unit 23. The head actuator 15 and the flexible printed circuit board unit 23 are thereafter incorporated in the main enclosure 12 of the HDD 11.

Figure 9:
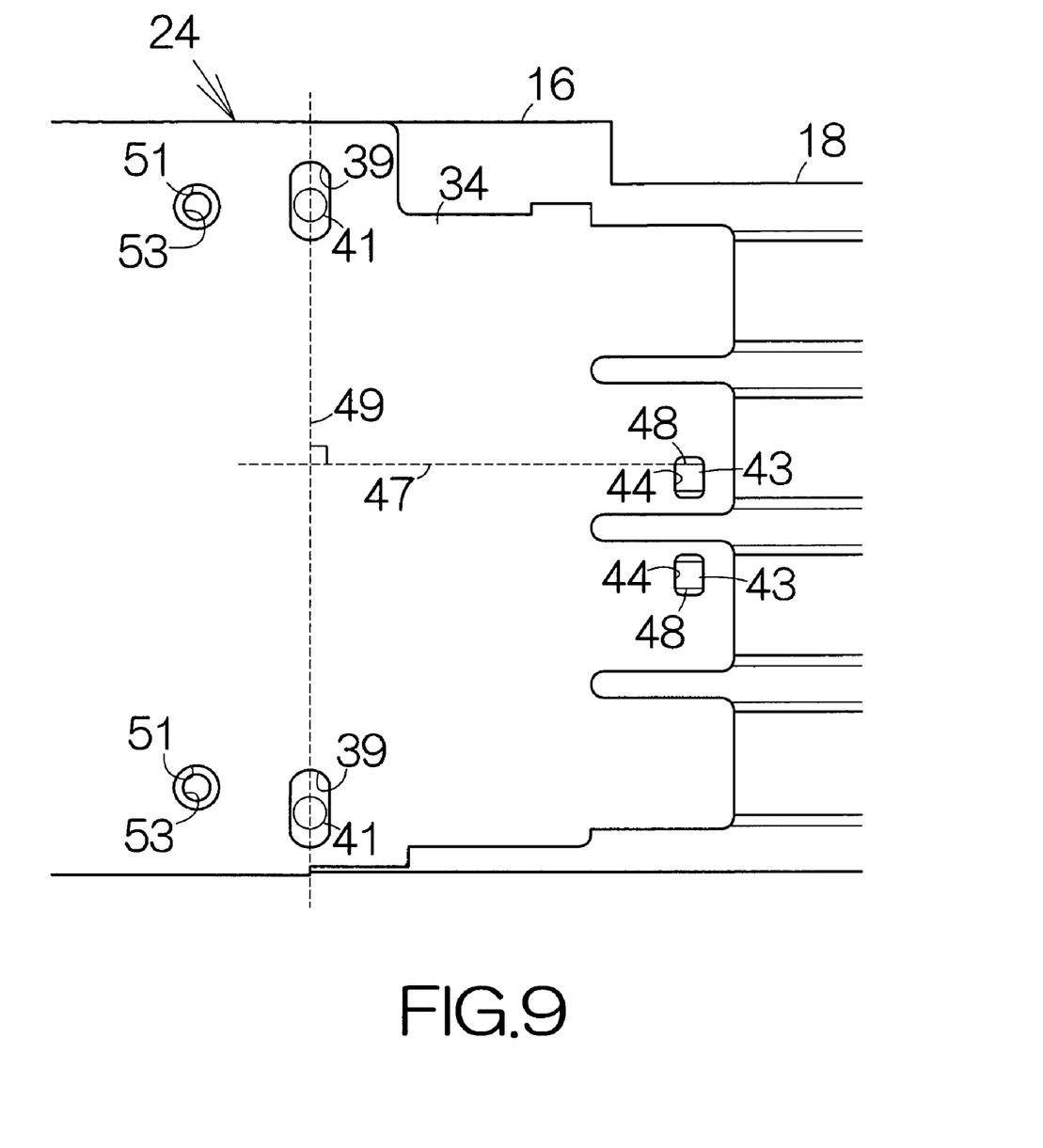
FIG. 9 is an enlarged plan view schematically illustrating alignment of the first flexible printed circuit board on a head actuator.

When the flexible printed circuit board unit 23 is fixed on the actuator block 16, the first flexible printed circuit board 24 is superposed on the surface of the actuator block 16. as shown in FIG. 9, for example. The elongated openings 39 of the first flexible printed circuit board 24 receive the insertion of the pins 41. Since the clearance is eliminated to the uttermost in the direction of the first reference lines 47 in the elongated openings 39, the first flexible printed circuit board 24 is accurately positioned in the horizontal direction.

The contour 48 of the electrically-conductive film piece 43 is detected within the aperture 44 with an image recognition apparatus. A specific number of electrically-conductive film pieces 43 may be selected for such a detection, for example. A shift is measured in the vertical direction in the first flexible printed circuit board 24. The amount of shift is measured based on a predetermined reference position. The first flexible printed circuit board 24 is positioned on the actuator block 16 based on the amount of shift measured. The positioning of the first flexible printed circuit board 24 can be realized with a high accuracy. In other words, since the predetermined clearance is defined for the pins 41 within the elongated openings 39 in the vertical direction, the first flexible printed circuit board 24 can be displaced on the actuator block 16 for establishment of a higher accuracy.

After the first flexible printed circuit board 24 has been positioned, the screws 38 are inserted into screw holes 53 defined in the actuator block 16. The first flexible printed circuit board 24 or flexible printed circuit board unit 23 is thus fixed on the actuator block 16. The pins 41 are thereafter coupled to the electrically-conductive layer 33 in the first flexible printed circuit board 24 with the solder materials 42 in the elongated openings 39.

Generally, the image recognition apparatus detects the contour 48 of the electrically-conductive film piece 43 based on detection of a reflection from the electrically-conductive film piece 43 or a reflection from the solder material attached on the electrically-conductive film piece 43. The adhesive 52 hinders generation of the reflection. As described above, when the adhesive 52 leaks inside the apertures 44 over the electrically-conductive film pieces 43, the image recognition apparatus cannot correctly recognize the electrically-conductive film pieces 43. The image recognition apparatus is unable to recognize the contour 48 of the electrically-conductive film piece 43 at a correct position.

Figure 10:
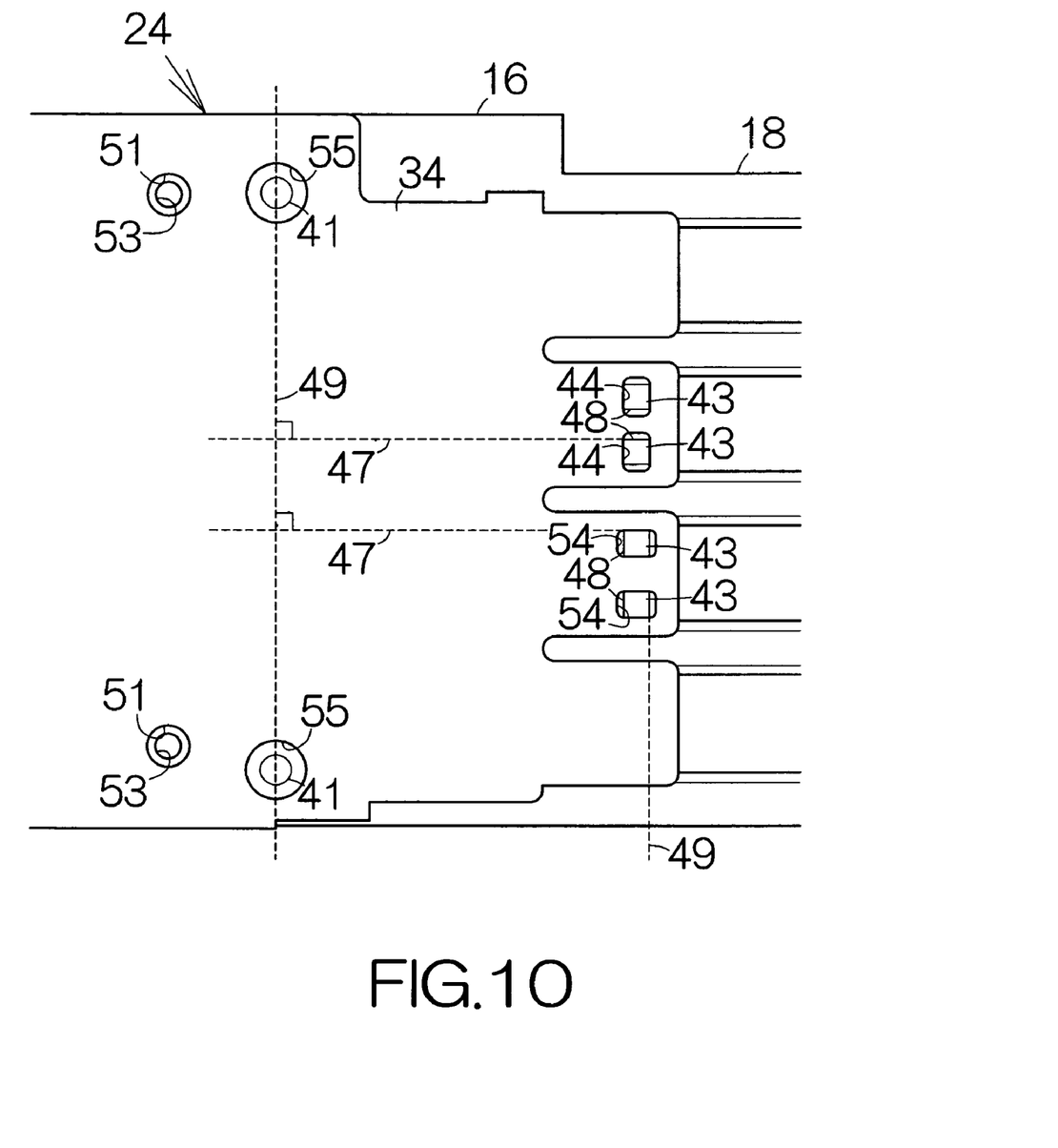
FIG. 10 is an enlarged plan view schematically illustrating alignment of the first flexible printed circuit board on the head actuator according to a modified example of the present invention.

As shown in FIG. 10, for example, apertures 54 may also be defined in the insulating layer 34 in addition to the aforementioned apertures 44. The apertures 54 may be utilized to expose the contours 48 of the electrically-conductive film pieces 43 along the second reference lines 49 on the first flexible printed circuit board 24. The apertures 54 are designed to cross the electrically-conductive film pieces 43 in the direction of the first reference lines 47. The insulating layer 34 is thus allowed to cover over the opposite ends of the electrically-conductive film pieces 43 in the direction of the second reference line 49. The insulating layer 34 in this manner partly covers over the contours 48 of the electrically-conductive film pieces 43. In this case, a clearance may be established for the pins 41 within through bores 55 which receive the insertion of the pins 41. The clearance is defined in the directions of the first and second reference lines 47, 49. Like reference numerals are attached to components or structures equivalent to those of the aforementioned first embodiment.

When the flexible printed circuit board unit 23 is fixed on the actuator block 16, the first flexible printed circuit board 24 is superposed on the surface of the actuator block 16. The image recognition apparatus is then utilized to detect the contours 48 of the electrically-conductive film pieces 43 within the apertures 44, 54. Here, two pairs of the electrically-conductive film pieces 43 within the apertures 44, 54 may be selected for such a detection, for example.

A shift is measured in the vertical direction in the first flexible printed circuit board 24 for the electrically-conductive film pieces 43 within the apertures 44. The amount of shift is measured based on a predetermined reference position. At the same time, a shift is measured in the horizontal direction in the first flexible printed circuit board 24 for the electrically-conductive film pieces 43 within the apertures 54. The first flexible printed circuit board 24 is positioned on the actuator block 16 based on the amounts of shift measured. The positioning of the first flexible printed circuit board 24 can be realized with a high accuracy. Since the predetermined clearance is defined for the pins 41 within the through bores 55 in the directions of the first and second reference lines 47, 49, the first flexible printed circuit board 24 can be displaced on the actuator block 16 for establishment of a higher accuracy.

What is claimed is:

1. A recording disk drive comprising:

an enclosure;

a recording disk enclosed in the enclosure;

a head actuator designed to change its attitude relative to the recording disk in the enclosure;

a fixing member disposed in the enclosure, the fixing member spaced from the head actuator by a predetermined distance;

a flexible printed circuit board extending at least from the head actuator to the fixing member and superposed on a surface of the fixing member, the flexible printed circuit board bending between the bead actuator and the fixing member;

a viscoelastic layer overlaid on a surface of the flexible printed circuit board; and a holding member separate from said fixing member, the flexible printed circuit board and the viscoelastic layer extending between the fixing member and the holding member, the holding member holding the viscoelestic layer and the flexible printed circuit board against the fixing member, wherein the viscoelastic layer is overlaid on the holding member over a predetermined length in a longitude direction of the flexible printed circuit board the predetermined length being shorter than a length over which the flexible printed circuit board is overlaid on the fixing member.

2. The recording disk drive recording to claim 1, further comprising an adhesive layer interposed between the viscoelastic layer and the flexible printed circuit board so as to adhere the viscoelastic layer to the flexible printed circuit board.

3. The recording disk drive according to claim 2, wherein the viscoelastic layer is positioned on the surface of the flexible printed circuit board at an area supported on a stationary fixing member.

4. The recording disk drive according to claim 3, wherein the viscoelastic layer is clipped to the stationary fixing member at the area of the flexible printed circuit board.

5. The recording disk drive according to claim 1, wherein the holding member clips the fixing member, the flexible printed circuit board and the viscoelastic layer.

* * * * *